METHOD OF PICKING UP AND BONDING SEMI-CONDUCTOR WAFERS TO A CARRIER

Original Filed Oct. 15, 1964

INVENTORS.
EARL A. ZANGER, JR.
PETER R. SZASZ

John B. Sowell
ATTORNEY.

INVENTORS.
EARL A. ZANGER, JR.
PETER R. SZASZ
John B. Powell
ATTORNEY.

INVENTORS.
EARL A. ZANGER, JR.
PETER R. SZASZ

John B. Sowell
ATTORNEY.

United States Patent Office 3,568,307
Patented Mar. 9, 1971

3,568,307
METHOD OF PICKING UP AND BONDING SEMICONDUCTOR WAFERS TO A CARRIER
Earl A. Zanger, San Jose, and Peter R. Szasz, Bear Valley, Calif., assignors to Kulicke and Soffa Industries, Inc., Fort Washington, Pa.
Application Aug. 9, 1967, Ser. No. 659,539, now Patent 3,458,102, which is a continuation of application Ser. No. 404,035, Oct. 15, 1964. Divided and this application Apr. 10, 1969, Ser. No. 815,117
Int. Cl. B01j *17/00;* H01l *7/02, 7/16*
U.S. Cl. 29—589 5 Claims

ABSTRACT OF THE DISCLOSURE

A mechanized method of picking up a partially preoriented semiconductor wafer from a plurality of semiconductor wafers on a tray, orienting the semiconductor wafer during the step of picking it up and simultaneously placing and bonding the semiconductor wafer on a carrier in a desired predetermined position.

This is a division of application Ser. No. 659,539, filed Aug. 9, 1967, now Patent No. 3,458,102, as a continuation of application Ser. No. 404,035, filed Oct. 15, 1964.

BACKGROUND OF THE INVENTION

In the fabrication of semiconductor devices, individual dice or microcircuit wafers having surface electrodes or indicia thereon are first bonded to headers, substrates, or flat-back components prior to the connection of lead wires to the terminal posts of the devices and coupling of the individual surface electrodes with each other. At the present time, these surface electrodes or contacts may vary from 2 to as many as 20 in number, each having a typical dimension from a few tenths of a mil wide to from 2 to 12 mils in length. A typical header assembly of this type has a body diameter of perhaps a few tenths of an inch and a height of approximately the same dimension. The semiconductor or microcircuit die which is mounted on the body of the header may be approximately 25 mils square and a few thousandths of an inch in thickness. The thickness across any particular die may vary so as to produce a generally wedge-shaped configuration, and the edges of these dice may have a trapezoidal configuration which results from the crystalline construction of the semiconductor from which it is formed after the larger slab has been cracked along its scribed lines.

The usual means for assembling these dice upon their component assemblies has been to pick up an individual wafer die by its upper surface using a hypodermic-type needle or tubular member having a vacuum applied to its bore and transferring the dice to the header or substrate element. Such a system is fully described in prior U.S. Pat. No. 3,083,291 entitled "Device for Mounting and Bonding Semiconductor Wafers." However, in engaging the upper die surface the needle was likely to damage the very delicate contacts disposed within the center portion thereof, especially in the case of multicontact microcircuits. Furthermore, this mode of handling could also result in substantial contamination of the contacts whereby it would become impossible to produce a satisfactory bond with lead wire subsequently attached. Moreover, because of the wedge-shaped thickness of the dice themselves, it was difficult for the needles of the prior systems to provide uniform contact pressure sufficient to form a consistent bond between the die and its header. In addition, because of the nature of the contact between the earlier hypodermic needle and the die, there was undue heat loss from the die during the bonding operation which greatly interfered with consistency in bonding. Hence, all of these deficiencies impeded high rates of production so desirable in highly competitive semiconductor device manufacture. The prior art method of grasping and picking up semiconductor devices did not orient and position the devices relative to the pick-up tool, therefore an additional step of positioning the device upon the carrier was required if accurate placement was desired.

SUMMARY OF THE INVENTION

The present invention overcomes the limitations of the prior art by orienting a semiconductor wafer in a recess in a bonding tool simultaneously with the steps of picking up and grasping the wafer. The oriented wafer is held from rotation and lateral movement in the bonding tool during the bonding operation, but permitted to tilt so that the bottom of the wafer is parallel to the carrier. The bonding tool exerts a novel combination of forces upon the semiconductor wafer causing the wafer to be accurately positioned on a carrier in a predetermined position during a bonding operation, as well as producing more consistent bonds at higher rates of production. Therefore, it is the primary object of the present invention to present a fast, accurate and dependable method of picking up semiconductor wafers from a tray and bonding them in a predetermined position on a carrier.

Yet a further object of this invention is to provide a method for picking up and bonding semiconductor wafers to headers whereby each wafer becomes self-aligned and centered regardless of variations in thickness and peripheral configuration.

A further object of this invention is to provide a method for bonding semiconductor wafers in which eutectic formation is accelerated.

Other objects of this invention are to provide an improved method for bonding semiconductor wafers, that is easily and economically executed and that is highly efficient and effective in operation.

With the above and related objects in view, this invention comprises a novel combination of steps for eutectic die bonding as will be more fully understood from the following detailed description when read in conjunction with the accompanying drawings in which:

DESCRIPTION OF A PREFERRED EMBODIMENT

Figures 5, 9:
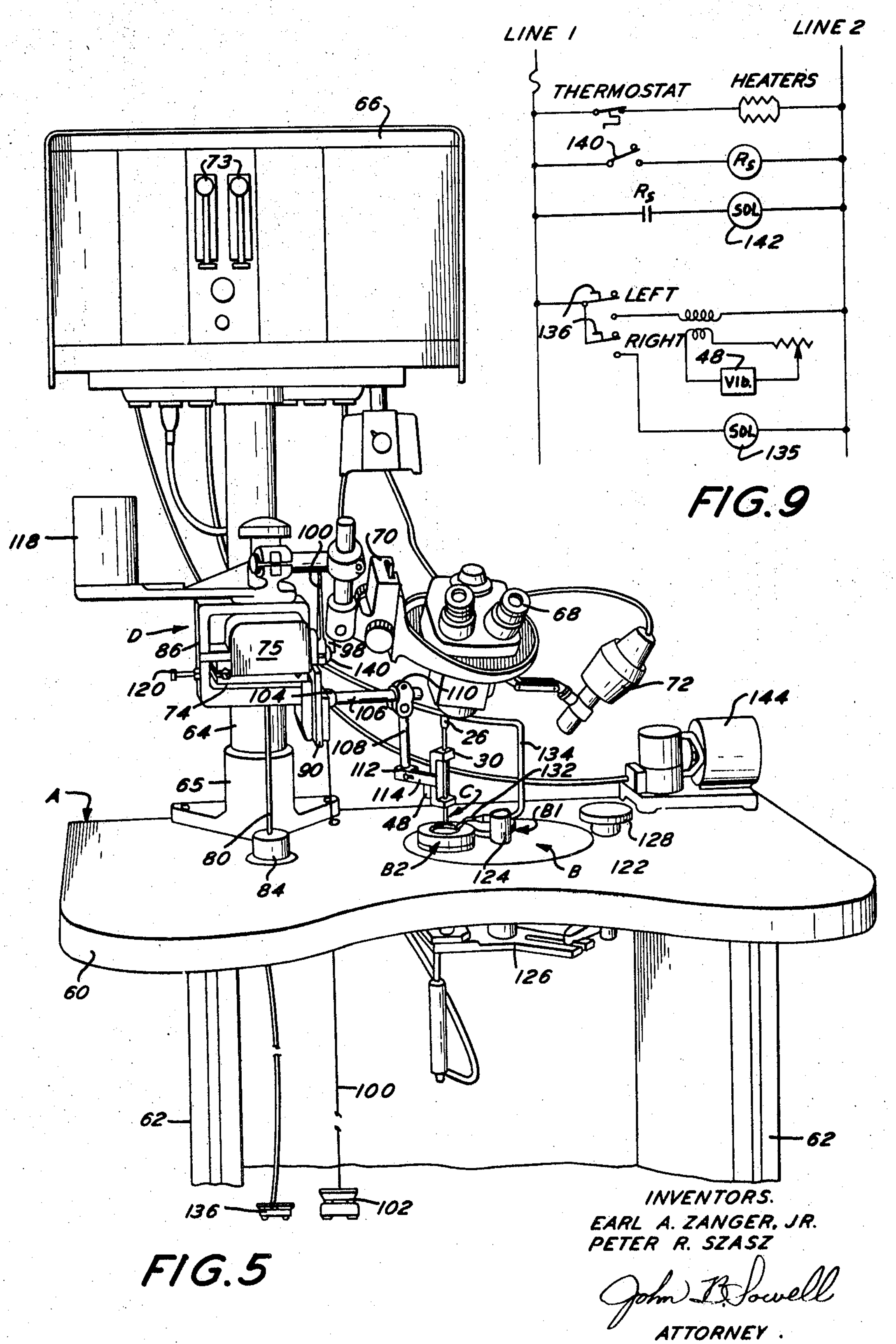
FIG. 5 is a perspective view of a wafer bonding apparatus embodying this invention.
FIG. 9 is an across-the-line schematic diagram of the electrical circuitry embodied in this invention.

Referring now in greater detail to the drawings in which similar reference characters refer to similar parts, and specifically to FIG. 5, the apparatus of the instant invention includes a frame, generally designated as A, a rotary work stage B supported in said frame, a wafer pick-up and bonding tool C mounted above said stage and carried by a micro-manipulator assembly D for precise movement along X-, Y- and Z-axes.

Figure 6:
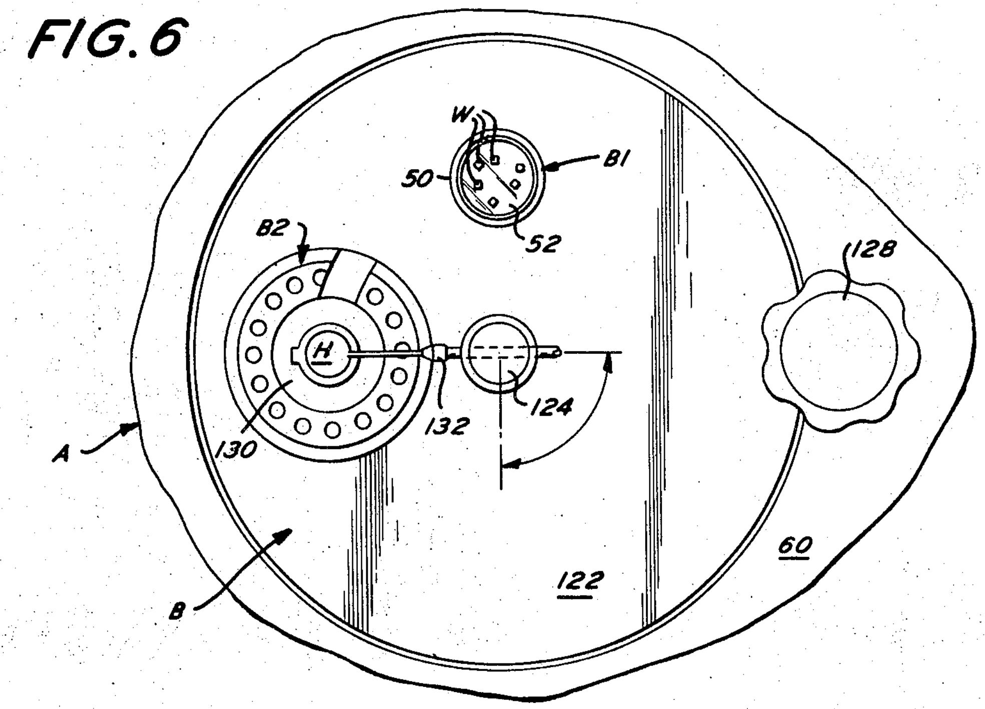
FIG. 6 is a top plan view of a rotary table containing a pick-up tray in one quadrant and a heating platen in a second quadrant.
Figure 8:
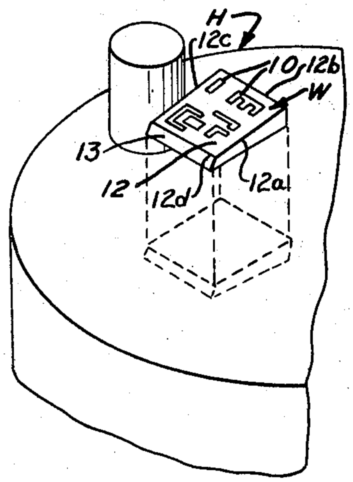
FIG. 8 is an enlarged perspective view of a typical wafer die and the header upon which it is to be bonded.

A plurality of wafers or dice W are loaded into a tray B1 placed in one quadrant of the rotary work stage B and a header H is mounted within a heating platen B2 at a second quadrant normally 90° from the tray. See FIG. 6. Literally hundreds of dice W may be in the tray B1 during each loading although only a few are illustrated for purposes of clarity in view of their small size. An enlarged view of a microcircuit wafer or die W is shown in FIG. 8, it being the function of this invention to pick-up one wafer at a time from the tray and transfer it to the top of the header H for bonding.

Each wafer W is of generally square configuration and comprises a chip of germanium or silicon semiconductor material, for example, which has discrete electrodes 10, termed "geometry" alloyed or otherwise formed on the upper surface 12 thereof. These dice W have been previously sliced or scribed from a larger slab upon which the geometry was incorporated in regularly defined rows and files. From FIG. 8 it is to be observed that the edges 11 and 13 of the wafers may be trapezoidal in configuration which results from breaking of the crystalline semiconductor slabs along the scribed lines and also because of possible non-uniformity in thickness which yields a wedge between the upper and lower surfaces.

Figures 1, 2, 3, 3A, 4:
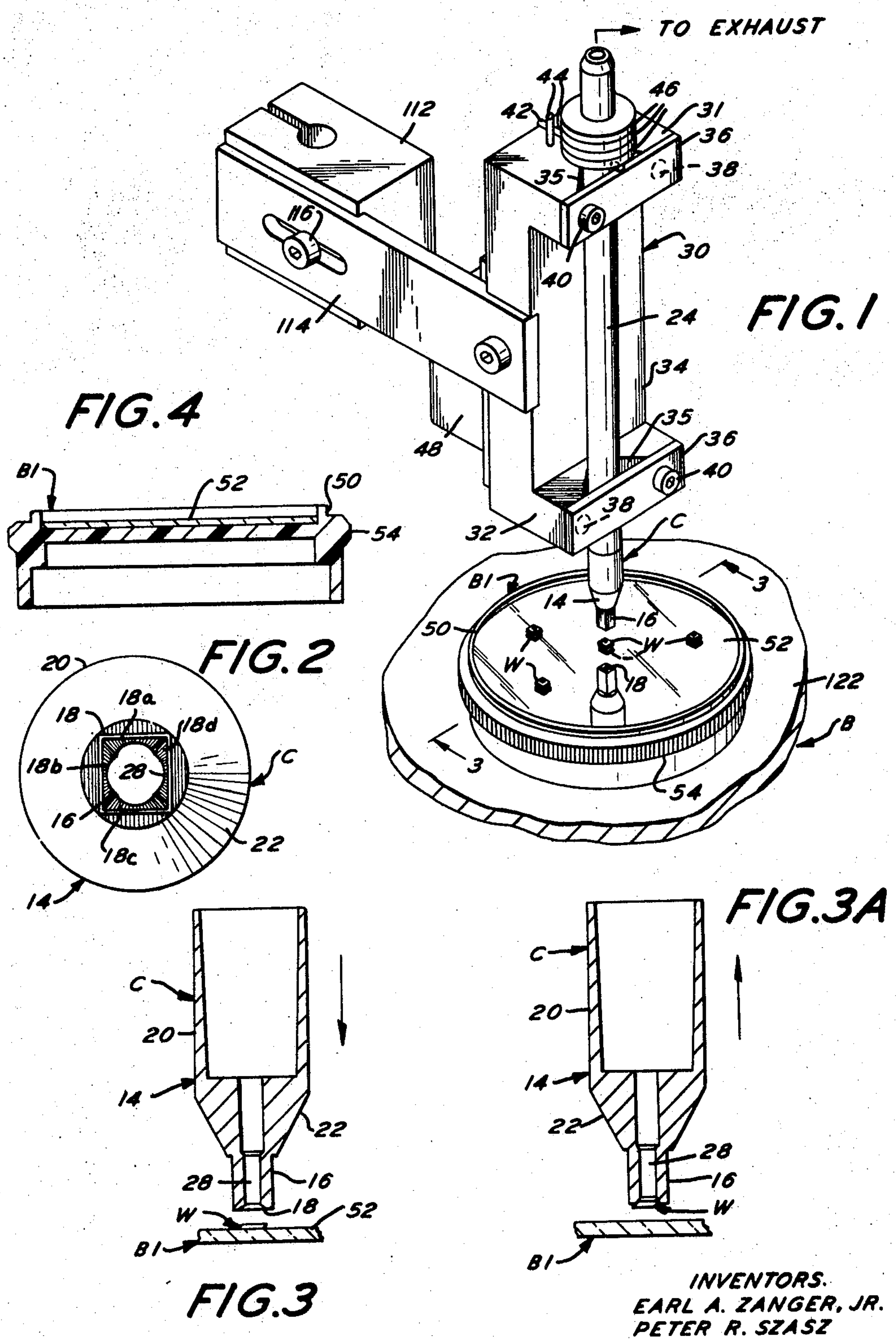
FIG. 1 is a perspective view of a wafer pick-up and bonding apparatus adapted to carry out the process of this invention.
FIG. 2 is an enlarged bottom plan view of the wafer pick-up and bonding tool.
FIG. 3 is a sectional view taken along lines 3—3 of FIG. 1.
FIG. 3A is a sectional view similar to FIG. 3 with the wafer being grasped by the tool.
FIG. 4 is a sectional view of a mirrored wafer tray embodied in this invention.

Referring to FIGS. 1, 2 and 3, the pick-up and bonding tool C comprises a collet 14, preferably of stainless steel or hard carbide, having a lower end 16 of square plan configuration into the tip of which is formed an inverted pyramidal surface 18. The pyramidal surface includes four facets **18*a*, 18*b*, 18*c* and 18*d* which are each oriented at an angle of 30° to 45° from the plane of the tip and in registration with the corresponding wall of the square lower end 16. As will be more apparent hereinafter, the squared configuration of the collet's end 16 and pyramidal surface 18 facilitates its alignments with the die W under microscope observation as the collet 14 is manipulated preparatory to pick up. Thus, each die W is grasped substantially at the four upper perimetrical portions 12*a*, 12*b*, 12*c* and 12*d* thereof within the respective facets of the pyramidal surface 18 without the surface electrodes 10** being touched in any way.

The collet 14 has a tubular body portion 20 which is tapered at 22 so as not to interfere with the line of sight during observation under a microscope. The body portion 20 is tapered and press fitted over the correspondingly tapered lower end of a tubular member 24 in communication with an exhaust line 26. A drilled bore 28 in the collet 14 extends from the pyramidal surface 18 through the tip 16 and tapered shank 22 to the interior of the body portion 20.

Referring to FIG. 1, the tool C, the tubular member 24 with its depending collet 14, is slidably supported along a vertical axis in a head 30. The head 30 is a C-shaped member having a pair of vertically spaced arms 31 and 32 which extend horizontally from a medial portion 34. Each of the arms 31 and 32 has a V-groove 35 which acts as a vertical guideway for the tubular member 24. Plate straps 36 are secured to the face of each of the arms 31 and 32 by socket head screws 40 at one side of the V-grooves. Cone pointed set screws 38 are threaded into tapped holes extending through the arms 31 and 32 and bear against the inner face of the straps 36 at the opposite side of the V-grooves. Adjustment of the set screws 38 permits variation in the bearing pressure of the plate straps 36 against the wall of tubular member 24, and the adjustment is made so that the tool C is free to slide vertically with minimal lateral play. A pin 42 transversely extends through the upper portion of tubular member 24 and restricts the tool C from descending below a predetermined vertical level with respect to the head. The rearward portion of the pin 42 is slidably contained between a pair of dowels 44 upstanding from arm 31 so as to maintain the polar orientation of the collet tip 16 in a fixed position. Washers 46 may be placed around the tubular member 24 and rest on the pin 42 whereby the loading force of the pick-up and bonding tool C can be varied. A vibrator element 48 which may be a standard bell buzzer, for example an Edwards Lungen #15, size "0," is mounted on the back of the head 30 and is electrically actuated during the bonding of the wafer W to the header H. This causes the tool C to oscillate whereby the wafer W grasped therein is scrubbed against the header H to speed up eutectic formation.

The tray B1 is a shallow disk-like receptacle which is slidable on the surface of the rotary table B. It includes a circular bezel portion 50 which embraces a glass-mirrored disk 52 for holding the wafers W themselves. The periphery of the bezel 50 is knurled at 54 in order to facilitate the grasping of the tray B1 by the operator's fingers and coarsely orienting one die W at a time along X-, Y- and rotary axes under the tip of the tool C. The back surface mirror on the disk 52 facilitates the registration of each die W with respect to the pyramidal surface 18 by permitting observation of the pyramidal surface 18 through its reflected image. This is especially important during the fine positioning of the tool C above the wafer because of the fact that the squared tip 16 of the collet 14 is somewhat larger than the individual dice themselves and would otherwise obscure a wafer from view when the tool C is directly thereabove.

Referring now to FIG. 5, the frame A includes a polished table top 60 of a hard thermo-setting plastic material, such as phenol formaldehyde or urea formaldehyde resin, which is supported above the floor by suitable legs 62. A post 64 is mounted upon the table top 60 by a bracket 65 and supports a console modular unit 66 containing the various electrical and gas control components. The manipulator D upon which the pick-up and bonding tool C is mounted is adjustably affixed to the post 64 by suitable brackets (not shown). A stereo-microscope 68 is hingedly supported upon a pod 70 which is clamped to the upper portion of the manipulator housing so that the operator may conveniently orient the microscope into a position focused over the work and observe the operations under three-dimensional magnification. A suitable illuminator 72 projects a beam of light upon the surface of the rotary stage B immediately below the tool C. Flow meters 73 and associated gas control valves are exposed on the face of the console 16 for convenient adjustment of pressure and rates of flow.

Figure 7:
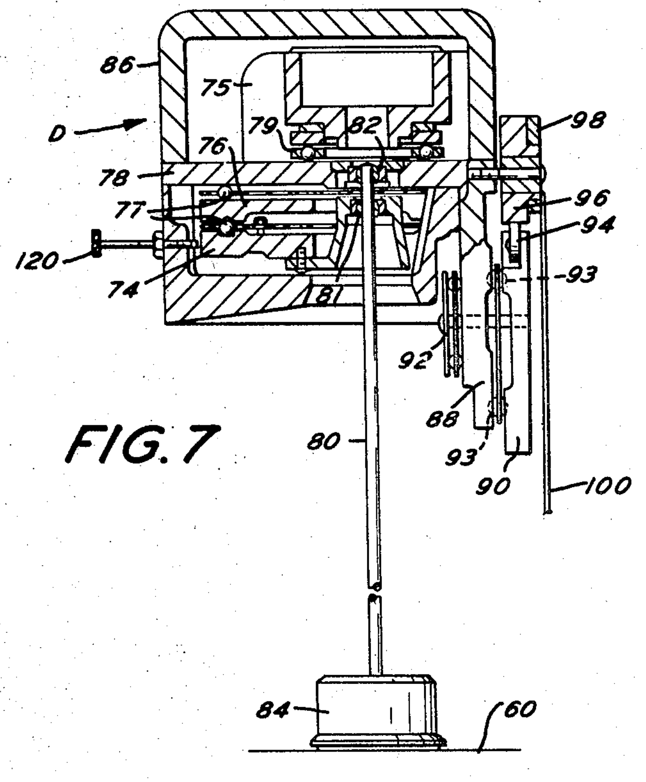
FIG. 7 is a sectional view of a micromanipulator for horizontally positioning and vertically reciprocating the tool with respect to the wafers and then depressing the tool with the wafer grasped therein into bonding contact with a header assembly contained in the heating platen.

The manipulator D comprises a micropositioning assembly substantially identical to that fully shown and described in U.S. Pat. No. 3,149,510, issued Sept. 22, 1964, for an invention by Frederick W. Kulicke, Jr., in "Fine Wire Manipulator and Bonding Instrument for Transistors." As is best illustrated in FIG. 7, a fixed base stage 74 which is carried in yoke 75 affixed to column 64, carries a first stage slider 76 which is slidable on balls 77 contained within respective races and is movable into and out of the plane of the paper as shown in FIG. 7. A second stage slider 78 also glides on balls 77 carried within respective raceways therein upon the first stage slider 76 from right to left or from left to right as shown in FIG. 7. Thrust bearing 79 resiliently compresses the first and second stage sliders between the yoke 75 and the base stage 74. Rod 80 which is coupled to a universal bearing 81 in the yoke 75 and universal bearing 82 in the second stage slider 78 downwardly depends therefrom through the first stage slider 76 and the base 74 where it is coupled at its lower end to a finger piece 84 slidable upon the table top 60. Horizontal positioning or movement of the finger piece 84, called a "chessman," upon the surface of the table top 60 transmits a proportionally reduced movement along the corresponding horizontal X- and Y-axes through the sliders to housing 86 which is secured to the second stage slider 78. A vertical guideway plate 88 is secured to the right hand edge of the housing 86, as shown in FIG. 7, and slidably supports Z-axis slider 90 which is coupled to the face thereof by a spring carriage 92 and glides upon balls 93 contained within respective vertical raceways. Internal springs (not shown) bias the Z-axis slider 90 upwardly so that a roller 94 at its upper edge is urged into abutment with eccentric 96 rotatably supported upon the housing 86. A crank arm 98 is connected with the eccentric 96, and a string 100 couples the outboard end of the crank 98 to a foot treadle 102 resting on the floor. Depression of the foot treadle 102 actuates the crank arm 98 through the cord 100 so as to urge the Z-axis slider downwardly against the bias of the springs. This correspondingly depresses the bonding tool C into engagement with a wafer and thereafter the wafer retained therein into contact with a header H in the heating platen B2.

Horizontally extending from the face of Z-slider plate 90 is rod 104 mounted in collar 106 secured thereto. A vertical pivot rod 108 downwardly depends from socket 110 affixed to horizontal rod 104. Split clamp block 112 is secured to the lower end of pivot rod 108, and slotted bar 114, which is secured at one end to the head 30, is slidably adjusted horizontally upon block 112 by screw 116. A counterweight 118 is mounted upon the manipulator housing 86 and offset therefrom to compensate for the off-balance load of the tool C and its supporting linkage. Thumbscrew stops 120 at the left of the housing 86 of manipulator D and at the rear of the manipulator (not shown) provide an adjustable limit for the final position of the dice upon the header H in the heating platen B2. The thumbscrew stop 120 which is shown is adjusted so that it will bear against the base stage 74 when the tool C is centered in an horizontal X-direction above the header H in the platen B2 after the stage B has been rotated into the position shown in FIG. 6, i.e. bonding position. Similarly, the thumbscrew stop not shown but at the rear of the manipulator D is adjusted so that it will bear against the base stage 74 when the tool C is centered in a horizontal Y-direction above the header H.

The work stage B comprises a turntable 122 which is rotatable with a vertical shaft 124 journalled within a Geneva drive assembly 126 supported under the table top 60. It is not deemed important with respect to the instant invention to go into detail of the Geneva drive system 126 except that the stage B may be rotated into one of two positions at 90° from each other by hand turning indexing knob 128 which is coupled to suitable camming and/or gearing below the table 60 which serves to turn the Geneva drive 126 and detentively lock the turntable 122 at 90° quadrants. See FIG. 6. It is to be noted that any manner of shifting the position of the wafers W and the headers H in the heating platen B2 with respect to the tool C may be employed, for example, the apparatus shown in Pat. No. 3,083,291 entitled "Device for Mounting and Bonding Semiconductor Wafers," or in Kulicke & Soffa Catalogue Sheet and Instruction Manual, Series 601–U, dated Dec. 30, 1963, entitled "Steady State Wafer Bonders."

The heating platen B2 comprises a holder 130 for detachably receiving a wafer W grasped in the tool C. A thermostatically controlled heating element, as illustrated in FIG. 9, is contained within the holder 130 and elevates the temperature of each successive header H to that whereupon a eutectic bond may be formed as each wafer W is depressed upon the header surface. A supply of nitrogen cooling gas is intermittently supplied to nozzle 132 through tubing 134 which is coupled by way of a solenoid-actuated valve (not shown) in the module 66 to a tank or bottle of nitrogen under pressure. As shown in FIG. 9, the solenoid 135 of the cooling valve is actuated by depressing double-pole foot switch 136 on the floor at its right hand portion. This energizes the solenoid in a conventional manner and permits a large volume of nitrogen cooling gas to envelop the header H and freeze the bond. Depression of the foot switch 136 at its left portion energizes the vibrator 48 during the bonding operation and oscillates the tool C whereby the wafer W grasped therein and urged into contact with the header H will scrub the header's surface and speed up eutectic formation.

A microswitch 140 is mounted on the manipulator housing 86 and has normally open contacts which are closed by the depression of the Z-axis slider 90 below a predetermined level. As shown in FIG. 9, the microswitch 140 is series connected with a stepping relay $R_s$ across the line 102. The stepping relay contacts $R_s$ are alternately closed and opened with each closure of the microswitch contacts and operate vacuum solenoid 142 which controls a valve (not shown) in the module 66 for permitting a vacuum to be supplied to the tool C through tubing 26 from exhaust pump 144. The last-mentioned valve is a conventional three-way type which vents the vacuum for the tool C to atmosphere when solenoid 142 is deenergized thereby permitting the die W held in the collet 14 to be released instantly during bonding.

As is apparent from the foregoing description, the operation of the wafer pick-up and bonding tool and the method for transferring the wafer dice W and bonding them to the headers H is as follows:

A plurality of the dice W are loaded upon the mirror disk 52 of the tray B1 with the contacts 10 facing upwardly. A header H is mounted using a tweezers within the platen B2 which has been elevated to a temperature of approximately 300° C. Index knob 128 is turned until the turntable B is rotated and detented into a position with the tray B1 under the tool C. While observing the work under the microscope 68, the tray B1 is slidably oriented by hand upon the surface of turntable 122 until one wafer W is coarsely positioned below the tool C along X-, Y- and polar axes. It is to be understood that other types of trays can be employed to present a partially oriented wafer under the tool C.

The foot treadle 102 is partially depressed until the tool C is immediately spaced above the wafer W in a "hovering" position, and the finger piece 84 is slidably oriented upon the table top 60 until the collet 14 is in precise registration with the wafer. The reflected image of the pyramidal surface 18 and the image of the wafer from the mirror 52 is observed under the microscope 68 to perform the alignment. The treadle 102 is now fully depressed thereby causing the facets 18 of the tool C to be urged into abutment with the upper perimetrical portions of the wafer. The tool C slides within the grooves 35 of the head 30 and bears with a predetermined substantially constant force upon the wafer, and the latter self-aligns itself within the pyramidal surface. When the Z-slider plate 90 has descended to a predetermined level (a level at which the tool C has already touched the wafer), the crank lever 98 causes the microswitch 140 to close and energize stepping relay $R_s$. At this step, solenoid 142 is energized and a vacuum applied to the bore 28 of the tool C. Accordingly, the wafer W is grasped at its upper perimetrical portions or upper marginal edges by the pyramidal facets 18. (See FIG. 3.)

Releasing the foot treadle 102, elevates the tool C with the wafer W retained in the collet 14 since solenoid 142 remains energized even upon re-opening of the microswitch 140. The lower surface of the wafer is retained parallel to the upper face of the turntable 122. (See FIG. 3A.)

The index knob 128 is now turned until the stage B is rotated and locked in a position with the platen B2 under the tool C. See FIG. 6. The manipulator D is moved by finger piece 84 against stops 120 or micropositioned so that the wafer W is properly oriented with respect to the subjacent header H.

Foot treadle 102 is depressed again to bring the wafer W grasped in the tool C into contact with the surface of header H. Microswitch 140 releases and energizes stepping relay $R_s$ which now opens its contacts thereby deenergizing vacuum solenoid 142 and immediately venting the vacuum to atmosphere. While still holding the treadle 102 down, the left side of foot switch 136 is depressed and causes actuation of vibrator 48. The tool C oscillates and scrubs the lower surface of the wafer in the collet 14 against the header H thereby abrading away interfacial oxides. Note that the loading force is applied about the perimetrical portions of the wafer and a uniform pressure exerted without touching the central portion thereof. Minimal heat loss is effected since only line contact by the facets of the instant tool is made with the perimetrical portions of the wafer W rather than the surface-to-surface contact made by prior art tools. When a fillet appears about the periphery of the wafer, the left side of foot switch 136 is released to stop oscillations, and the right side of said foot switch depressed to actuate solenoid 135 thereby directing flow of cooled nitrogen through nozzle 132 upon the header H with the wafer thereon to freeze the eutectic bond. Foot treadle 102 is released so that tool C is again elevated. Knob 128 is again rotated to bring the tray B1 under the tool C and the platen B2 to the front of the table 60. The wafer bonded header is removed, foot switch 136 fully released, and a fresh header H inserted.

The cycle is repeated for subsequent bonds.

Although this invention has been described in considerable detail, such description is intended as being illustrative rather than limiting since the invention may be variously embodied wthout departing from its spirit and the scope of the invention is to be determined as claimed.

We claim:

1. A method of picking up a semiconductor device of the type having substantially flat top and bottom surfaces parallel one to another and having side surfaces generally perpendicular thereto, the top and bottom perimetrical edges of each device being shaped as a convex polygon and one of said surfaces supporting a plurality of electrode geometries comprising:

placing a plurality of semiconductor devices on a pick-up dish, moving said pick-up dish with said semiconductor devices relative to a bonding tool to place a semiconductor device in an approximate predetermined X, Y, and rotary orientation relative to said bonding tool, moving said bonding tool downwardly, engaging a plurality of individually upwardly and inwardly inclined geometrical surfaces in a recessed working face in the tip of the bonding tool in a line or edge contact with the upper perimetrical edges of the semiconductor device thereby camming the device into position in the working face of the bonding tool without touching the electrode geometries on the device and aligning the device in a final predetermined X, Y and rotary position relative to said bonding tool, connecting suction means ot the tip of the bonding tool to hold the semiconductor device in said final predetermined position, raising said bonding tool and moving the tool relative to a carrier until the tool presents the aligned semiconductor device over a selected area on the carrier, engaging the semiconductor device with the carrier until the device is bonded thereto in a predetermined X, Y and rotary position indicative of said inclined geometrical surfaces in the recessed working face of the bonding tool, and removing the suction means and the bonding tool.

2. A method of picking up a semiconductor device as set forth in claim 1, wherein an image of the bonding tool is aligned with the semiconductor device on the dish prior to engaging the tool with the perimetrical edges of the device.

3. The method of picking up a semiconductor device as set forth in claim 1, wherein the step of engaging the semiconductor device with the carrier further includes exerting a predetermined downward force on the bonding tool to entrap the device both horizontally and vertically in the recessed tip of the bonding tool.

4. The method of picking up a semiconductor device as set forth in claim 3, where the individually upwardly and inwardly inclined geometrical surfaces are substantially flat planes cooperating with said device to cam it into horizontal and rotary position and further permitting the bottom surface thereof to seat parallel to both the pick-up dish and the carrier surface while maintaining alignment.

5. A method of bonding rectangularly-shaped semiconductor devices to the surface of a carrier comprising the steps of:

placing a plurality of semiconductor devices on a tray having a horizontal mirrored surface, horizontally manipulating a bonding tool having an inverted pyramidal recessed surface in the tip thereof immediately over one die at a time while under microscopic observation, vertically aligning said device into registration with the reflected image of the pyramidal recessed surface from the mirror, depressing the bonding tool into contact with the device so that the upper perimetrical portion only of the device will be touched by the pyramidal recessed surface, aligning the device in the tip of the tool by vertically engaging the pyramidal surface with the device, applying a suction through the bonding tool to the recess in the tip so as to grasp the device in the bonding tool, elevating the tool and horizontally positioning said tool over a carrier, lowering the tool until the device is urged into contact with the surface of the carrier, and vibrating said bonding tool and simultaneously applying vertical and horizontal forces to the perimetrical edges of the device, thereby bonding the device to the surface of the carrier.

References Cited

UNITED STATES PATENTS

| | | | |
|---|---|---|---|
| 1,037,851 | 9/1912 | Beam | 51—235 |
| 2,915,201 | 12/1959 | Calehuff et al. | 214—1 |
| 3,009,560 | 11/1961 | Frazier. | |
| 3,051,026 | 8/1962 | Costa | 228—6 |
| 3,083,291 | 3/1963 | Soffa et al. | 219—85 |
| 3,310,216 | 3/1967 | Kollner et al. | 228—6X |
| 3,357,090 | 12/1967 | Tiffany | 228—3X |
| 3,361,891 | 1/1968 | Whitefield | 228—6X |

JOHN F. CAMPBELL, Primary Examiner

R. J. SHORE, Assistant Examiner

U.S. Cl. X.R.

228—49